United States Patent
Rohde

(10) Patent No.: US 11,563,425 B2
(45) Date of Patent: Jan. 24, 2023

(54) LINEAR-PHASE FIR AUDIO FILTER, PRODUCTION METHOD AND SIGNAL PROCESSOR

(71) Applicant: Robert Bosch GmbH, Stuttgart (DE)

(72) Inventor: Axel Rohde, Straubing (DE)

(73) Assignee: Robert Bosch GmbH, Stuttgart (DE)

(*) Notice: Subject to any disclaimer, the term of this patent is extended or adjusted under 35 U.S.C. 154(b) by 39 days.

(21) Appl. No.: 17/055,724

(22) PCT Filed: May 3, 2019

(86) PCT No.: PCT/EP2019/061324
§ 371 (c)(1),
(2) Date: Nov. 16, 2020

(87) PCT Pub. No.: WO2019/219401
PCT Pub. Date: Nov. 21, 2019

(65) Prior Publication Data
US 2021/0211118 A1    Jul. 8, 2021

(30) Foreign Application Priority Data

May 16, 2018  (DE) .............. 10 2018 207 604.9

(51) Int. Cl.
*H03H 17/02* (2006.01)
*H03H 17/06* (2006.01)
*H03H 17/00* (2006.01)

(52) U.S. Cl.
CPC ........ *H03H 17/0229* (2013.01); *H03H 17/06* (2013.01); *H03H 2017/0081* (2013.01)

(58) Field of Classification Search
CPC ..................... H03H 17/0229; H03H 17/06
See application file for complete search history.

(56) References Cited

U.S. PATENT DOCUMENTS

| 3,860,892 A | 1/1975 | Speiser et al. | |
|---|---|---|---|
| 2005/0171989 A1* | 8/2005 | Koyanagi | H03H 17/06 708/301 |
| 2007/0078354 A1* | 4/2007 | Holland | A61B 5/318 600/509 |

FOREIGN PATENT DOCUMENTS

EP    1605590 A1    12/2005

OTHER PUBLICATIONS

Wenzel et al., "Sound Lab: A real-time, software-based system for the study of spatial hearing", 108th Convention of the Audio Engineering Society, 2000, 27 pages.
(Continued)

*Primary Examiner* — Chuong D Ngo
(74) *Attorney, Agent, or Firm* — Michael Best & Friedrich LLP

(57) ABSTRACT

Systems and methods for producing a linear-phase digital FIR filter from two sub-filters for an audio signal. In one method, the sub-filters are provided as sub-sets having numbers of coefficients, a lower cutoff frequency of the particular sub-filter being greater than the sampling frequency of the audio signal divided by the number. The sub-sets are linearly convoluted with one another so as to form a total set having a number of coefficients greater than the numbers, and the total set is symmetrically reduced to a number less than the number, so as to form a reduced total set of the filter. A linear-phase digital FIR filter for an audio signal is created by the method.

9 Claims, 5 Drawing Sheets

(56) References Cited

OTHER PUBLICATIONS

Dauchot, "Experimenting with DSP", Electronics World + Wireless World, Nexus Media Communications, 1993, vol. 99, No. 1692, pp. 920-925.
Smith, "Chapter 7: Properties of Convolution", The Scientist and Engineer's Guide to Digital Signal Processing, 1997, pp. 123-140.
Translation of International Search Report for Application No. PCT/EP2019/061324 dated Aug. 12, 2019 (3 pages).

* cited by examiner

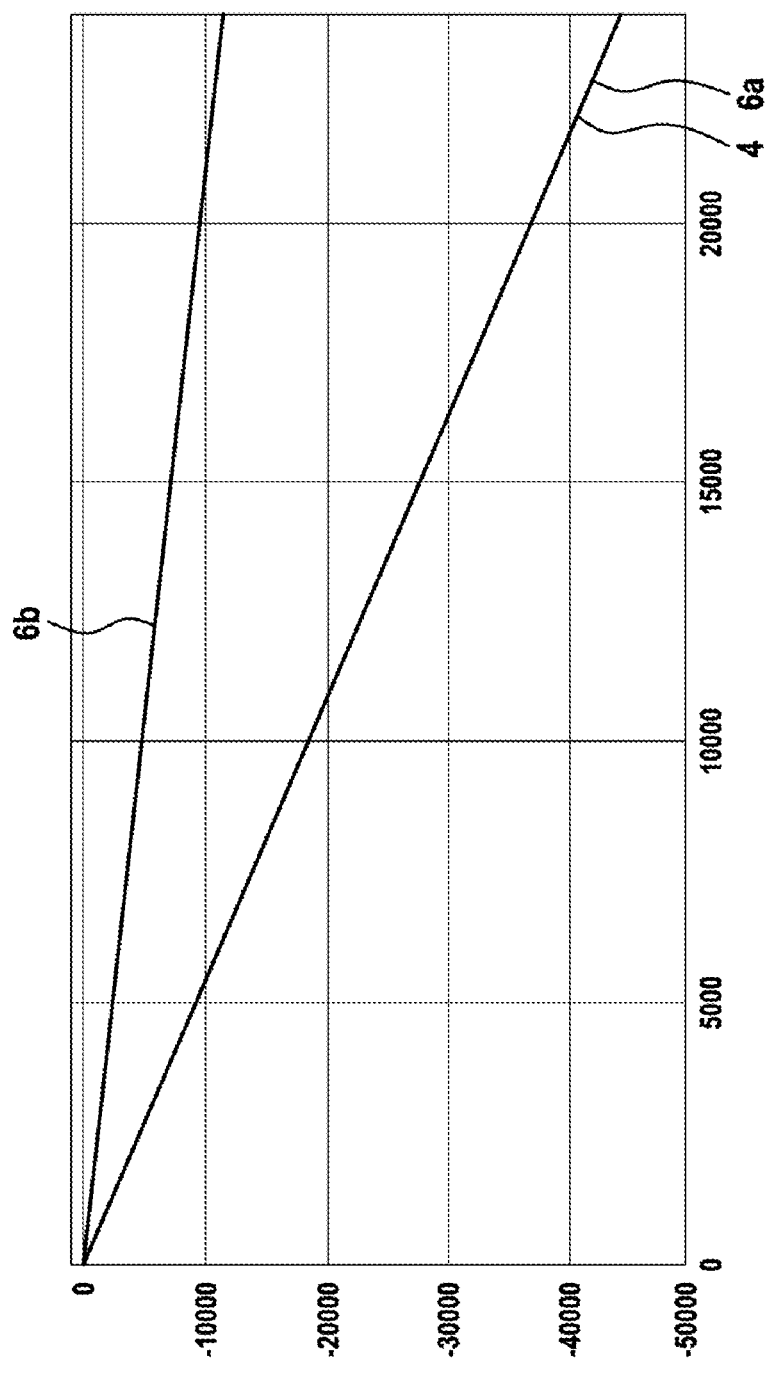

LINEAR-PHASE FIR AUDIO FILTER, PRODUCTION METHOD AND SIGNAL PROCESSOR

BACKGROUND OF THE INVENTION

The use of digital filters is known in audio technology. For example, EP 2 123 106 B1 discloses an active filter in the form of a digital sound processor. The filter is used in a loudspeaker arrangement to supply mid-range drivers with a band-pass signal, high-frequency drivers with a high-pass signal, and woofer drivers with a low-pass signal.

SUMMARY OF THE INVENTION

Within the scope of the present invention, a method is provided for generating a linear-phase digital FIR (finite impulse response) filter for an audio signal. Preferred or advantageous embodiments of the present invention and of other invention categories emerge from the further claims, the following description, and the attached figures.

The FIR filter comprises two individual linear-phase digital FIR subfilters for respectively subfiltering the audio signal. The two subfilters are provided initially as subsets having a respective number of coefficients. The intended or desired basic filter functionality of the FIR filter is that which results if the audio signal filter were to be successively filtered by both subfilters. The respective lower limit frequency of the respective subfilter is greater than the ratio of the sampling frequency (sampling rate) of the audio signal to be processed as intended, divided by the respective number of coefficients of the subfilter. The two subsets are subsequently linearly convoluted with one another to form a sum set. The number of coefficients of the sum set is consequently or necessarily the greater of the respective number of coefficients of the subsets. Finally, the sum set is symmetrically truncated to a smaller number of coefficients with respect to the number of the sum set. The smaller number is in particular that of one of the two subsets. In particular, it is the larger number of the two subsets. The truncated sum set constitutes the coefficient set for the FIR filter, which is or was thus generated from the subfilters as a kind of "sum filter."

In the case of filters having multiple characteristic frequencies, for example, in the case of a band-pass filter or a shelving filter, the "lower limit frequency" actually refers to the lowest of these frequencies. In the case of other filters, for example, a low-pass or high-pass filter, which have only one characteristic frequency, this characteristic frequency may be understood to mean "lower limit frequency."

The lower limit frequency of the shelving filter is generally a small multiple ($\geq 3$) of the lower limit frequency, which is determined by the ratio of the sampling frequency of the audio signal (unfiltered, filtered) divided by the respective number of coefficients of the subsets.

In particular, at least one of the subsets is truncated and weighted via a window function before the convolution. There are actually no untruncated subsets/coefficient sets in FIR (finite impulse response) filters. "Untruncated" would be synonymous with "infinitely long" and could no longer be processed. Such a window function is, for example, a Hamming, von Hann, Blackman, or Kaiser-Bessel function, or a comparable function. Said window function is used to limit the subfilter to a desired number of coefficients.

In particular, the method according to the present invention is used for filters which are active in the medium to high range of an audio signal, i.e., in particular filters which are used in the frequency range from 500 Hz, from 750 Hz, from 1000 Hz, from 1200 Hz, or from 1500 Hz, or of which the lower limit frequency has at least the aforementioned values. This allows satisfaction of the aforementioned condition (number of coefficients, sampling frequency, lower limit frequency) for common sampling rates in the audio range (for example, 44.1 kHz/48 kHz/96 kHz, 192 kHz) and common audio or quality or performance requirements for audio systems (for example, public address systems, home audio, etc.).

In contrast to the simple series connection of a second subfilter in the signal path of the audio signal downstream of a first subfilter, according to the present invention, a lower number of coefficients of the sum filter results which is less than the sum of the coefficients of the two subfilters, thus resulting in a lower latency than would have occurred by means of the two original subfilters. In particular, there is no increase in the latency, for example, with respect to a first filter, if the number of coefficients of the sum filter is equal to that of the first subfilter. Phase linearity is thus maintained. None of the subfilters, nor the (sum) filter, must be implemented as an IIR (infinite impulse response) filter.

In a preferred embodiment of the present invention, three alternatives are proposed for the linear convolution:

In a first alternative, the subsets are convoluted to form the sum set by means of a direct linear convolution in the time domain.

In a second alternative, the subsets are indirectly linearly convoluted as follows: the subsets are first Fourier-transformed into the frequency domain. Subsequently, the transforms are complex-multiplied to form a sum transform. Subsequently, the coefficients of the sum set are formed as the real component of an inverse Fourier transform of the sum transform.

A third alternative applies only to the case in which the subfilters have the same number of coefficients. Here, in principle, an approach according to the second alternative (transformation—multiplication—reverse transformation with formation of a real component) is used. However, for the multiplication, scalar multiplication of the complex-valued one transform by the value of the complex-valued other transform is performed to form a sum transform.

By means of the three alternatives, a particularly simple and suitably selectable option for convoluting the coefficients or coefficient sets is provided in each case.

However, the three aforementioned alternatives are not limited to merging FIR filter coefficients which exist in the time domain. If the Fourier transforms of the filter coefficients exist in an alternative embodiment, only the Fourier transform specified in the second and third alternatives is omitted.

In a preferred embodiment, the sum set is truncated via a window function by means of weighting. As a result, various properties of the subfilters are also maintained to the greatest possible extent in the overall filter.

In a preferred variant of this embodiment, a function acting predominantly in a boundary range of a maximum of 20% is used as a window function. "Predominantly" means that it should not be ruled out that a window function within the middle 80% of the coefficient set differs from the value one. In particular, the window function is not limited "predominantly," but rather, at most, to the boundary range of $\leq 20\%$. The expression "at most 20%" means "$\leq 20\%$," meaning at most 20%, in particular at most 20%, at most 15%, at most 10%, or at most 5%.

Thus, in particular, a function acting at most in a boundary range of 20% (of the coefficient range) is used. In particular, the boundary range extends to a maximum of 15%, a maximum of 10%, a maximum 5% of the coefficient range. Thus, the window function is then not active (or in the case of "predominantly," not significantly active) in a center range of the coefficient set between the boundary ranges, and thus ultimately corresponds to the multiplication of the coefficients by a constant value, in particular "1". This results in a retention of the slope edge steepness in the sum filter in the case of the truncation of the coefficient set. In particular, the known Tukey function is used as a window function; in particular, its parameter alpha has a value of at least 0.9. The truncation of the sum set thus takes place via a less globally acting window function, whereby only the "outer" coefficients near the two cutoff edges are processed.

In a preferred embodiment, a shelving filter or another presence or absence filter is used as a first or second subfilter. Such a filter is particularly suitable for combination with the filters according to the present invention, for example, a combined frequency response correction and band-pass filter.

In a preferred variant of this embodiment, the shelving filter has an attenuation having a constant value, in particular the value d, i.e., "d dB," in particular 0 dB for d=0, for frequencies below a lower limit frequency, and an attenuation for higher frequencies which is generally not equal to the constant value (d dB, 0 dB). In this case, the factor d is any constant floating-point number; "generally" means that the condition does not always have to be strictly fulfilled; for example, deviations which are hardly noticeable or measurable are allowed. In particular, the condition is strictly fulfilled, i.e., the limitation "generally" is not applicable. Therefore, no combination with other filters has to take place in the range below the limit frequency (comparatively low-frequency range). A combination according to the present invention takes place only for the range starting from the limit frequency (comparatively high-frequency range), in which the method according to the present invention can be used particularly well.

In a further preferred variant of this embodiment, the shelving filter accordingly has an attenuation of 0+d dB for frequencies below a lower limit frequency, and an attenuation not equal to 0+d dB for higher frequencies. The constant factor d is any floating-point number. Therefore, no combination with other filters has to take place in the range below the limit frequency (comparatively low-frequency range), but rather only multiplication of the filter coefficients by the factor d. Combination according to the present invention takes only for the range starting from the limit frequency (comparatively high-frequency range), in which the method according to the present invention can be used particularly well.

For this purpose, the following is described: for a filter which leaves the input signal and its frequency response unchanged, all coefficients are zero except for one. The coefficient which is different from zero is the value 1. If the latter is changed, the frequency response of the filter is still flat; however, the filter now has an attenuation or amplification. In other words, the filter can be replaced by an amplifier or an attenuator (voltage divider).

In a preferred embodiment, a filter having a lower crossover frequency which is higher than the limit frequency is used as a first or second subfilter. In particular in combination with the shelving filter (first or second subfilter), the corresponding filter is used as the respective other filter (second or first). The lower crossover frequency is the one as from which the filter becomes noticeably active with respect to its filter function, for example, the lower limit frequency of a band filter (band-pass or band-stop) or the limit frequency of a high-pass or low-pass filter. Corresponding filters are particularly suitable for use in the present method, in particular for combination with a shelving filter according to the present invention.

In a preferred variant of this embodiment, a band filter, in particular a band-pass filter, in particular a frequency response correction and band-pass filter, or a high-pass filter, is used as such a subfilter. Such filters are particularly suitable for the method according to the present invention, in particular if they are designed for the bass/mid-range, mid-range, or high-frequency range of audio signals.

In addition, within the scope of the present invention, a linear-phase digital FIR filter for an audio signal is disclosed. The filter is or has been generated via the method according to the present invention.

The filter and at least a portion of its embodiments, and the respective advantages, have already been correspondingly described in conjunction with the method according to the present invention.

Within the scope of the present invention, in addition, a signal processor for an audio signal is disclosed which comprises a filter according to the present invention.

The signal processor and at least a portion of the embodiments thereof, as well as the respective advantages, have already been correspondingly described in conjunction with the method according to the present invention and the filter according to the present invention.

The present invention is based on the following findings, observations, and considerations, and also comprises the subsequent embodiments. The embodiments are in part also referred to as "the present invention" for simplification. The embodiments may also comprise portions or combinations of the aforementioned embodiments, or may correspond to said embodiments, and/or may possibly also include embodiments which have not previously been mentioned.

The present invention is based on the following observations and findings:

Linear-phase FIR filters are used in a variety of ways in professional acoustic irradiation technology. Due to their phase linearity and their essential stability—two unique features with respect to IIR filters—they are preferably used for band filtering and for linearization of the frequency response in multipath loudspeaker systems. However, these advantages come at the price of the following disadvantage: an FIR filter having a certain frequency selectivity always requires a considerably higher order (and thus a higher number of coefficients and delay stages) than an equivalent IIR filter. The higher order thus necessarily causes a higher latency, i.e., a higher time delay of the filtered signal with respect to the original signal, which can easily exceed 10 milliseconds in particular in the case of cascading of multiple filters (subfilters). This is disadvantageous in particular in live transmissions, as speakers, singers, or instrumentalists may hear a noticeable delay in their own rendition.

From practice, it is known to configure the filters of the various frequency bands of multipath loudspeaker systems having an identical number of coefficients, in order to achieve the same latency for all paths of the loudspeaker system. Only in this way is the phase linearity maintained over all paths of the loudspeaker system. If filters (subfilters) having different functions are cascaded, for example, on the one hand, filters for band filtering and for linearization of the frequency response (first subfilter: frequency response correction and band-pass filter), and on the other hand, filters for compensating for level losses in the upper frequency range due to absorption for a particular venue (second subfilter: shelving filter), they are always calculated according to current practice in separate filter blocks (two subfilters). As a result, the latency increases necessarily and in an undesirable manner. Current variants include accepting this disadvantage or implementing shelving filters as IIR filters. As a result, the overall system loses its phase linearity.

So-called line-array systems are made up of relatively small loudspeaker boxes which are hung in the form of an arc, for example, between a hall ceiling and the surface, and which cover the frequency range from 80 Hz to 20 kHz. They are combined with large loudspeaker boxes standing on the surface, which reproduce the range below 100 Hz by means of multiple low-frequency loudspeakers (subwoofers). Since an FIR band filter having a limit frequency of 80 Hz and a sufficiently high slope edge steepness requires too many coefficients, and would thus cause a latency which is too high, it is customary to use IIR filters for the purpose of band separation between the low/mid-range system of the line array and the subwoofer. FIR frequency response correction and band filters for the low/mid-range system of the line array system having a transmission range of typically 80 Hz to 1.6 kHz accordingly have a low-pass characteristic instead of a band-pass characteristic.

The present invention is based on the following considerations:

As already mentioned initially, it is possible to configure the filters of the various frequency bands of multipath loudspeaker systems having an identical number of coefficients, in order to achieve an identical latency for all paths of the loudspeaker system. In this respect, the outer filter coefficients are not used expediently in the medium- and higher-frequency bands, since their values are very small with respect to the inner coefficients. The pitch perception capability of the human ear comprises a frequency range of approximately 20 Hz to 20 kHz. This corresponds to approximately 10 octaves. As the name implies, high-quality professional multipath loudspeakers typically split these ten octaves across three to four paths. The number of coefficients required for the filter function alone is inversely proportional to the lower limit frequency of an FIR filter. With each octave by which the lower limit frequency of an FIR filter increases, the number of coefficients required for the filter decreases. Accordingly, for the pure filter function of the high and medium-range paths, it would be possible to manage with significantly fewer coefficients (than for the lower-frequency paths). Conversely, this means that the outer coefficients of the two (higher-frequency) paths are not significant and can accordingly be truncated without significant loss in quality. The present invention exploits precisely this insight.

The present invention described here utilizes this principle in the following manner: filters (first/second subfilters) for filter functions, which, like presence shelving filters for compensating for hearing losses, relate only to upper- and medium-frequency ranges, are combined with filter blocks (second/first subfilters) operating in these frequency ranges. As a result, the number of coefficients initially increases (due to the convolution of the coefficient sets). Since the outer coefficients are not significant, they are truncated. Subsequently, the cutoff points of the resulting coefficient set can possibly be smoothed via a window function acting only the vicinity of the cutoff edges. After coefficient truncation, a window function must actually always or should be applied. As a result, two filters (subfilters) are combined to form a sum filter, without increasing the latency (by truncating the number of coefficients), and thus also without increasing the computing time in the digital signal processor.

As described further above, the band separation between the low/mid-range system of a line array and the subwoofer takes place by means of an IIR filter. The FIR filter for the low/mid-range system in the line array is used here only for correcting the frequency response and for low-pass filtering at the upper cutoff frequency of approximately 1.6 kHz. The FIR filter thus has a constant profile near 0 dB in the bass range. Accordingly, the FIR filters for line array systems likewise require relatively few coefficients, although low frequencies (≥80 Hz) are also reproduced. This factor also allows the use of the present invention in low-frequency bands without a high-pass component.

The present invention is used in preferred embodiments as follows:

First, a presence shelving filter is generated having a number of coefficients nshelv which is suitable for its lower limit frequency. Depending on the crossover frequency, this number is typically one-eighth to one-fourth of the coefficients of a loudspeaker band filter nspeaker. The shelving filter has a constant amplification of "1" (0 dB) from the bass frequency range up to the lower frequency range of the center band (20 Hz<f<700 Hz). Since the amplification in this range is not influenced by the shelving filter, there is no combination with the shelving filter for band and frequency response correction filters which operate in this range.

The combination of the filter blocks for the center and high bands via the shelving filter at the coefficient level takes place by means of the following methods:

1. In the first step, the combination of the filter coefficients of both (sub)filters takes place by means of the following methods, i.e., (the following method steps a or b or c are carried out alternatively):

a. The direct linear convolution of both filter coefficient sets (subsets) in the time domain.

b. The indirect linear convolution of both filter coefficient sets (subsets) by means of complex multiplication according to Fourier transformation into the frequency domain. The filter coefficients of the combined filter (sum filter, untruncated) are available as the real component of the subsequent inverse Fourier transformation.

c. The multiplication of the complex-valued Fourier-transformed filter coefficients of the one filter (one of the subfilters) by the value of the complex-valued Fourier-transformed filter coefficients of the other filter (other subfilter) for the case that both filters (subfilters) have the same number of coefficients. As in case b, an indirect linear convolution of both filter coefficient sets (subsets) takes place according to Fourier transformation into the frequency domain and by means of coefficient-wise scalar multiplication. Here, the complex-valued filter coefficients of the one filter (a subset) are multiplied by the value of the complex-valued filter coefficients of the other filter (other subset). This is made possible due to the fact that the complex-valued Fourier coefficients of both filters (subfilters) are on the same frequency grid. The filter coefficients of the combined filter (sum filter, untruncated) are available as the real component of the subsequent inverse Fourier transformation.

The precondition for the above steps is that coefficient sets mentioned above for the subfilters (for example, shelving and loudspeaker bands) have already been weighted via a suitable window function (for example, Hamming, von Hann, Blackman, Kaiser-Bessel, or others).

2. The resulting filter (sum filter, untruncated) has a higher overall number ntotal of coefficients ntotal=nspeaker+ nshelv−1 and thus also a higher latency, such that the phase-linearity is no longer provided in the overall system. As determined above, since the number of loudspeaker band filter coefficients nspeaker in the center and high bands is greater than necessary for their filter function, the resulting overall filter coefficient set ntotal can be truncated symmetrically back to the number nspeaker. Since in this case, the truncation of coefficients via a rectangular window largely affects only insignificant outer coefficients, it is expedient to apply a less globally acting window function such that of Tukey having a parameter alpha greater than or equal to 0.9, instead of again windowing via the usual window functions (Hamming, von Hann, Blackman, or others). As a result, at a maximum, the outer 5% of the coefficients near the two cutoff edges are processed.

The resulting filter (sum filter, truncated) has the same profile as the original loudspeaker band filter, for example, having high accuracy in the plateau regions of the shelving filter—only these regions can be compared by means of superimposition.

The effects of the coefficient truncation and windowing in the resulting filter (sum filter, truncated) with respect to the untruncated merged filter (sum filter, untruncated) are minimal. Even in the blocking regions of the resulting filter, only the smallest deviations are apparent at an attenuation of ≥90 dB. These deviations exist at low frequencies, as expected.

The phase response of a merged filter (sum filter, truncated) also corresponds highly precisely to that of the original (sub)filter (for example, loudspeaker band filter). The phase linearity of the original filter (subfilter) is thus maintained.

The present invention is not confined to multipath loudspeaker systems. The present invention can be used for the upper band (or the upper bands) of any transmission system which utilizes multiple bands in a phase-linear manner in a broad frequency range of five octaves (or more), and of which the signal experiences losses in the transmission path primarily in the upper frequency range.

According to the present invention, the merger of FIR filters results without increasing the latency.

BRIEF DESCRIPTION OF THE DRAWINGS

Additional features, effects, and advantages of the present invention will result from the following description of a preferred exemplary embodiment of the present invention and the attached figures. The following are depicted as schematic diagrams:

FIG. 6: phase responses of subfilters and sum filters according to FIG. 1.

DETAILED DESCRIPTION

Figure 1:
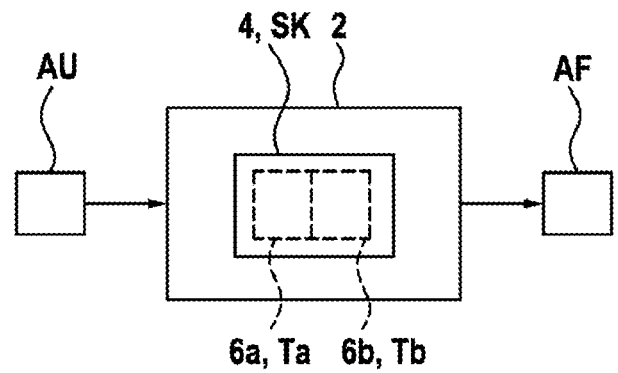
FIG. 1: a digital signal processor according to the present invention during operation.

FIG. 1 depicts a signal processor 2 during operation. Said processor comprises a linear-phase digital FIR filter 4 in the form of a coefficient set, here, a truncated sum set SK. During operation, an unfiltered audio signal AU is fed into the signal processor 2, filtered in said signal processor by the filter 4, and output as a filtered audio signal AF. The filter 4 is a combination filter and functionally comprises two series-connected individual filter functionalities in the form of linear-phase digital FIR subfilters 6a,b. The subfilter 6a is a frequency response correction and band-pass filter; the subfilter 6b is a shelving filter. Originally, i.e., with respect to their dimensioned and intended filter function, the subfilters 6a,b have respective filter characteristics according to respective full coefficient sets in the form of the subsets Ta,b. The signal processor 2 no longer comprises the subfilters 6a,b in this original form, but rather, said subfilters are already merged into the filter 4 in the form of a "sum filter."

Figure 2:
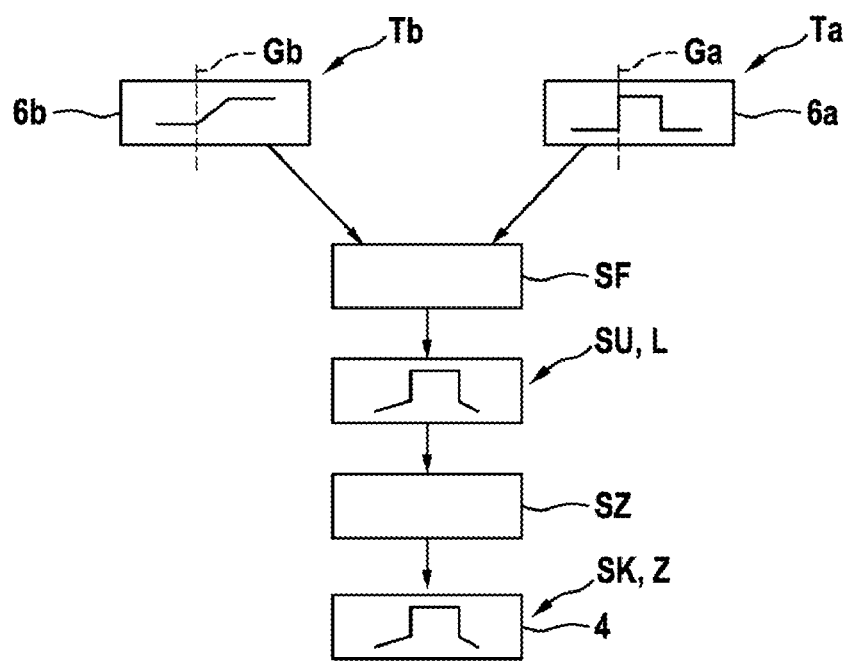
FIG. 2: a flow chart for generating the filter according to the present invention from FIG. 1.

FIG. 2 depicts a flow chart of a method according to which the filter 4 has been generated from the subfilters 6a,b by means of merging.

In the method, first, the two subfilters 6a,b are provided with their original full-fledged subsets Ta,b of coefficients. The sampling frequency for the audio signal AU, AF, here, 44.1 kHz, divided by the number Ma,b of coefficients (subsets Ta,b), here, 513 in each case, is approximately 86 Hz, and is respectively less than the lower limit frequency Ga,b of the subfilters 6a,b, here, Gb=1 kHz for the shelving filter (subfilter 6b) and Ga=1.8 kHz for the band-pass filter (subfilter 6a).

In a convolution step SF, the two subsets Ta,b are now linearly convoluted with one another to form a sum set SU. Said sum set now has the length or number (L) of coefficients. In the example, a direct linear convolution of the two filter coefficient sets or subsets Ta,b takes place in the time domain. The number L results in L=number(Ta)+number(Tb)−1=513+513−1=1025. The filter formed by the sum set SU of coefficients (sum filter, untruncated) now merges the characteristics of the two subfilters 6a,b.

Subsequently, in a truncation step SZ, a symmetrical truncation of the sum set SU is performed, resulting in a truncated sum set SK having a number Z=513 of coefficients. This takes place by using a Tukey window function having a parameter alpha of at least (≥) 0.9. The truncated sum set SK now describes the filter 4.

Figure 3:
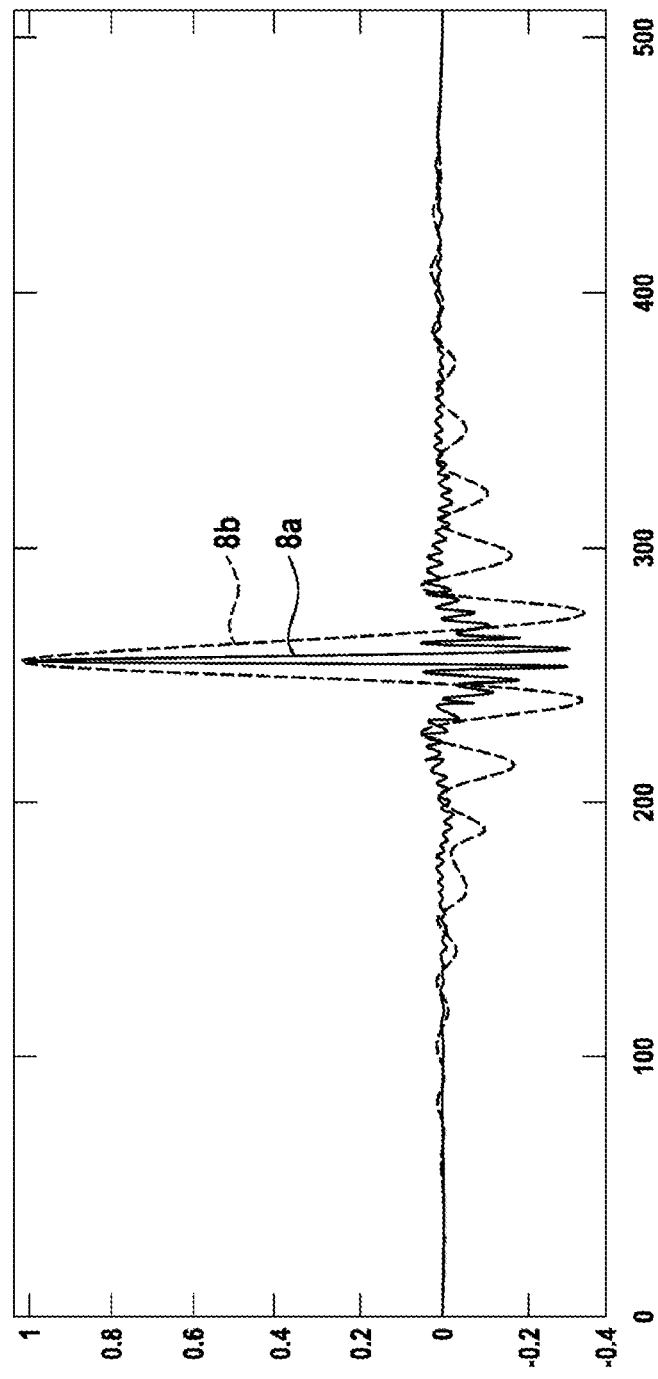
FIG. 3: coefficients of two band-pass filters.

FIG. 3 shows, by way of example and for illustrating the present invention, a diagram of respectively 513 coefficients of two linear-phase FIR band-pass filters 8a,b having the limit frequencies [200 Hz, 2 kHz] for band-pass filter 8b, and [1 kHz, 10 kHz] for band-pass filter 8a. For this comparison, the coefficient sets are normalized to 1. In the case of the band-pass filter 8a having the higher limit frequencies, the values of the outer coefficients converge significantly faster to zero. Therefore, in contrast to band-pass filters having lower limit frequencies for an identical number of coefficients, their influence on the frequency response of the filter is insignificant.

For filters which were generated with the aid of the method according to FIG. 2 depicted above, frequency and phase responses are depicted in the following FIGS. 4 to 6.

Figure 4:
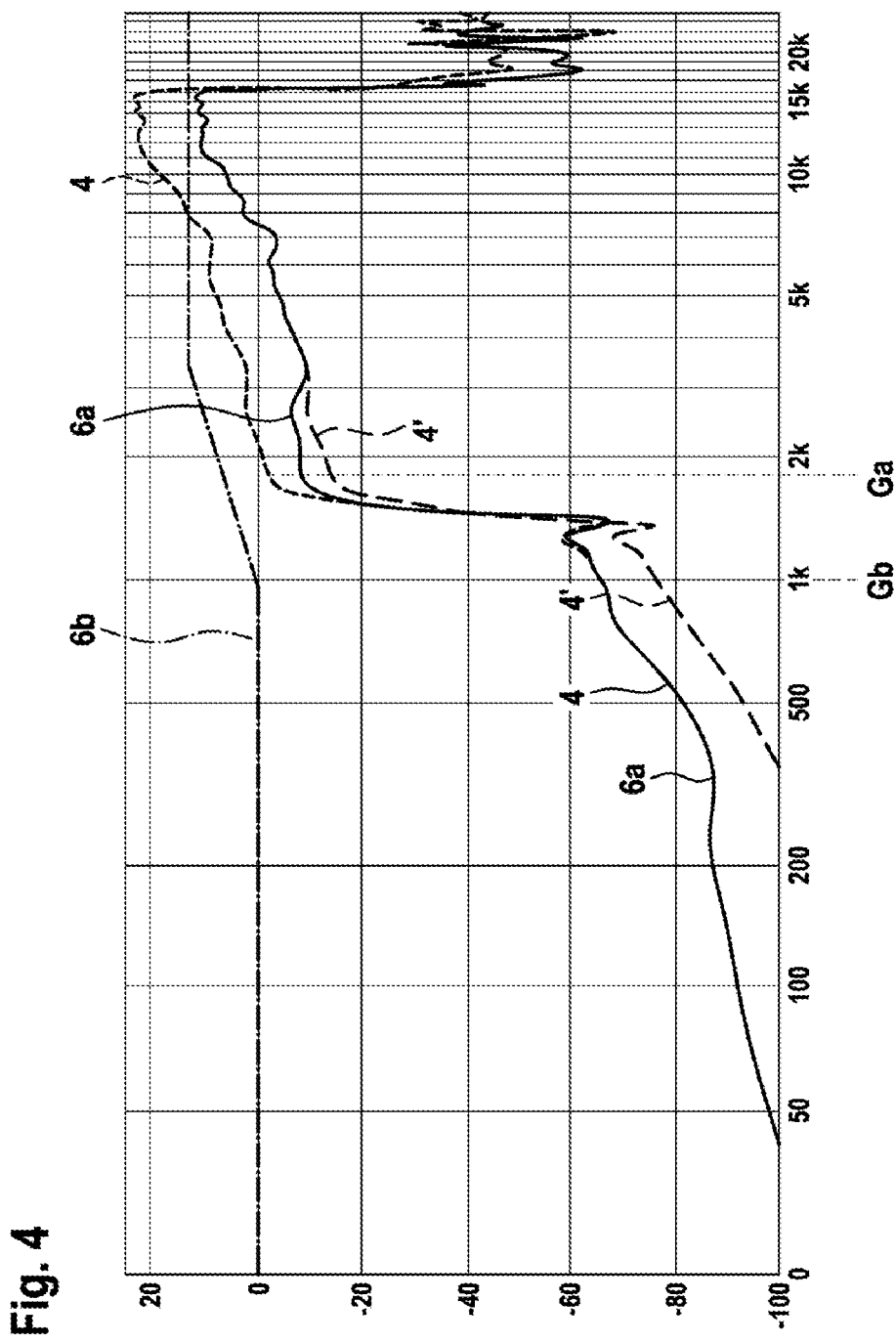
FIG. 4: various frequency responses of subfilters and sum filters from FIG. 1.

FIG. 4 depicts the frequency responses (attenuation/dB over frequency/Hz) for the subfilter 6b (shelving filter) having an increase of 12 dB in the upper plateau, for the subfilter 6a (loudspeaker band filter), for the merged filter 4 (sum filter, truncated), and once again for the merged filter 4, now, however, having an attenuation of 12 dB (graphical decrease, only for illustration), as the curve 4'. FIG. 4 thus depicts the frequency response of the subfilter 6a (frequency response correction and band filter), the frequency response of the subfilter 6b (shelving filter), and the frequency response of the merged filter 4 (sum filter untruncated). The curve 4' depicts the frequency response of the merged filter 4 reduced by 12 dB, i.e., by the amplification of the subfilter 6b (shelving filter) in the upper plateau. The resulting filter 4 exhibits the same profile as the original subfilter 6a (speaker band filter), with high accuracy in the plateau regions of the subfilter 6*b* (shelving filter)—only said plateau regions can be compared by means of superimposition: the curve for the filter 4 and the curve for the subfilter 6*a* coincide in the lower plateau region. In the upper plateau region, the shifted or lowered curve 4' for the filter 4 and the curve for the subfilter 6*a* coincide.

Figure 5:
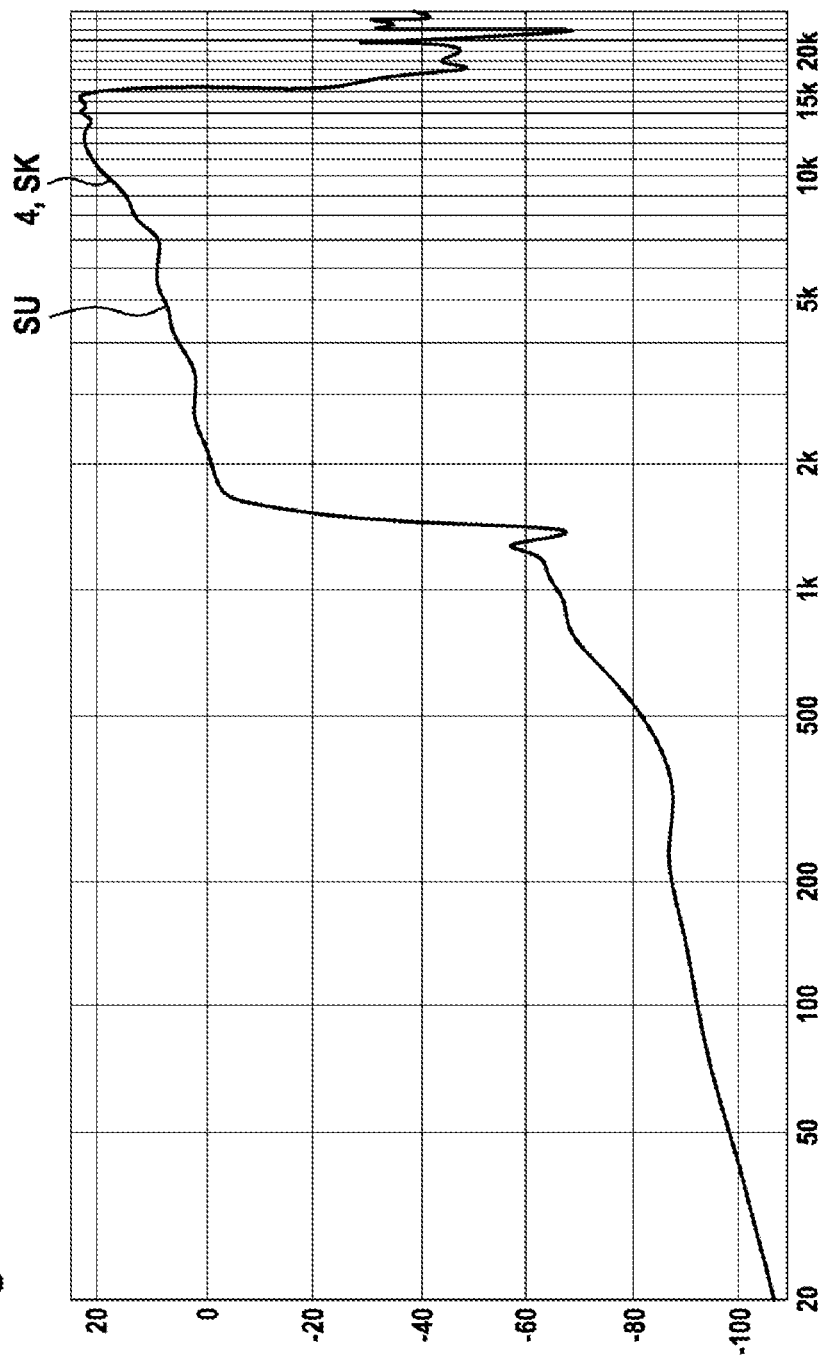
FIG. 5: frequency responses for untruncated and truncated sum sets according to FIG. 1.

FIG. 5 illustrates the effect of the coefficient truncation and the coefficient weighting via a Tukey window function, i.e., the effect of the method step "truncation step SZ," on the frequency response, on the basis of frequency responses (attenuation/dB over frequency/Hz). FIG. 5 shows that the effects of the coefficient truncation and windowing in the resulting filter 4 (truncated: coefficient set is the sum set SK) with respect to the untruncated merged filter (coefficient set: sum set SU) are minimal. Even in the blocking regions of the resulting filter 4, only the smallest deviations are apparent at an attenuation of ≥90 dB. These deviations exist at low frequencies, as expected.

FIG. 6 depicts the phase responses, (phase/degree over frequency/Hz) of the subfilter 6*b* (shelving filter), the subfilter 6*a* (loudspeaker filter), and the merged filter 4 (sum filter, truncated).

The phase response of the merged filter 4 also corresponds highly precisely to that of the original subfilter 6*a* (loudspeaker band filter). The phase linearity of the original (sub)filter is thus maintained.

The invention claimed is:

1. A method for generating a linear-phase digital FIR filter (4) for an audio signal (AU, AF), wherein the filter (4) comprises two individual linear-phase digital FIR subfilters (6*a,b*) for respectively subfiltering the audio signal (AU, AF), in which:
the two subfilters (6*a,b*) are provided as subsets (Ta,b)
having a respective number (Ma,b) of coefficients,
wherein a lower limit frequency (Ga,b) of the respective subfilter (6*a,b*) is greater than the ratio of the sampling frequency of the audio signal (AU, AF) divided by the respective number (Ma,b), the two subsets (Ta,b) are linearly convoluted with one another to form a sum set (SU) of which the number (L) of coefficients is the greater of the respective numbers (Ma,b) of the subsets (Ta,b), and the sum set (SU) is symmetrically truncated to a number (Z) which is less than the number (L), resulting in a truncated sum set (SK), in order to generate the filter (4) according to the truncated sum set (SK), and wherein a shelving filter is used as one of the two subfilters (6*a,b*).

2. The method as claimed in claim 1, wherein the subsets (Ta,b) are convoluted to form the sum set (SU) by means of a direct linear convolution in the time domain, or the subsets (Ta,b) are indirectly linearly convoluted by Fourier-transforming the subsets (Ta,b) into the frequency domain, and complex-multiplying the transforms to form a sum transform, and forming the coefficients of the sum set (SU) as the real component of a subsequent inverse Fourier transform of the sum transform, or the subsets (Ta,b) are indirectly linearly convoluted by Fourier-transforming the subsets (Ta,b) into the frequency domain, and, for the case that the subfilters (6*a,b*) have the same number (Ma,b) of coefficients, performing scalar multiplication of the complex-valued one transform by the value of the complex-valued other transform to form a sum transform, and forming the coefficients of the sum set (SU) as the real component of a subsequent inverse Fourier transform of the sum transforms.

3. The method as claimed in claim 1, wherein the sum set (SU) is truncated via a window function by means of weighting.

4. The method as claimed in claim 3, wherein a function acting predominantly in a boundary range of a maximum of 20% is used as a window function.

5. The method as claimed in claim 1, wherein the shelving filter has an attenuation having a constant value for frequencies below a lower limit frequency (6*a,b*), and has an attenuation for higher frequencies which is generally not equal to the constant value.

6. The method as claimed in claim 1, wherein a filter having a lower crossover frequency which is higher than the limit frequency (Ga,b) is used as a first or second subfilter (6*a,b*).

7. The method as claimed in claim 5, wherein a band filter (8*a,b*) or a high-pass filter is used as such a subfilter (6*a,b*).

8. A linear-phase digital FIR filter (4) for an audio signal (AU, AF), wherein said filter is generated via a method as claimed in claim 1.

9. A signal processor (2) for an audio signal (AU, AF), wherein said processor comprises a filter (4) as claimed in claim 8.

* * * * *